United States Patent
Lee et al.

(10) Patent No.: US 7,148,719 B2
(45) Date of Patent: Dec. 12, 2006

(54) METHOD FOR ANALYZING ORGANIC LIGHT-EMITTING DEVICE

(75) Inventors: Jou-hahn Lee, Gyeonggi-do (KR); Hyun-jun Shin, Gyeongsangbuk-do (KR); Jong-sun Lim, Yeongdeungpo-gu (KR); Ha-jin Song, Gyeongsangbuk-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 44 days.

(21) Appl. No.: 11/090,140

(22) Filed: Mar. 28, 2005

(65) Prior Publication Data

US 2005/0285618 A1 Dec. 29, 2005

(30) Foreign Application Priority Data

Jun. 26, 2004 (KR) .................. 10-2004-0048665

(51) Int. Cl.
*G01R 31/00* (2006.01)

(52) U.S. Cl. .................................... 324/770

(58) Field of Classification Search .............. None
See application file for complete search history.

(56) References Cited

U.S. PATENT DOCUMENTS

| 5,459,408 | A * | 10/1995 | Chen .................... 324/760 |
| 6,818,329 | B1 * | 11/2004 | Liao et al. ............... 428/690 |
| 6,918,946 | B1 * | 7/2005 | Korgel et al. ............. 75/362 |
| 2004/0097160 | A1 * | 5/2004 | Kaltenbach et al. ........ 445/3 |
| 2005/0048862 | A1 * | 3/2005 | Phelan et al. ............ 445/24 |

* cited by examiner

*Primary Examiner*—Vinh Nguyen
*Assistant Examiner*—Roberto Velez
(74) *Attorney, Agent, or Firm*—Buchanan Ingersoll PC

(57) ABSTRACT

Provided is a method for analyzing the performance of an OLED through activation in-situ. The method includes placing the OLED in an in-situ chamber, driving the OLED, and analyzing a dark spot and/or thermal degradation of the OLED, such that performance of the OLED can be analyzed while driving the OLED in-situ, separated from the external environment.

4 Claims, 5 Drawing Sheets
(2 of 5 Drawing Sheet(s) Filed in Color)

C 1s

Al 2p (metallic)

O 1s

METHOD FOR ANALYZING ORGANIC LIGHT-EMITTING DEVICE

BACKGROUND OF THE INVENTION

Priority is claimed to Korean Patent Application No. 10-2004-0048665, filed on Jun. 26, 2004, in the Korean Intellectual Property Office, the disclosure of which is incorporated herein in its entirety by reference.

1. Field of the Invention

The present invention relates to a method for analyzing an organic light-emitting device (OLED), and more particularly, to a method for analyzing the performance of an OLED through activation in-situ.

2. Description of the Related Art

OLEDs are a common type of display device, which use organic compounds to emit light without external illumination. OLEDs have a simpler structure and are easier to manufacture than thin film transistor liquid crystal displays (TFT LCDs). That is, OLEDs have lower production costs, and have just one half the power consumption and one third the thickness of TFT LCDs, while having a response rate 1000 times faster. Thus, OLEDs are used in moving picture applications, such as mobile phones, PDAs, etc.

However, OLEDs have the problems of short lifetime and low efficiency. Research into overcoming these problems is hampered by a lack of techniques for analyzing OLEDs, due to their organic thin film multi-layered structure. Furthermore, in a conventional estimation method, when the characteristics of OLEDs are estimated ex-situ while being driven, the OLEDs are sensitive to the external environment, making estimation unreliable.

Conventional methods of analyzing OLEDs comprise ex-situ estimating the characteristics of the devices using conventional surface analysis apparatus, such as X-ray photoelectron spectroscopy (XPS), Ultraviolet Photoemission Spectroscopy (UPS), Raman, or Scanning Electron Microscopy (SEM), etc.

In these cases, oxygen and moisture contacts the devices causing direct thermal degradation in less than one second. Thus, when using the above conventional surface analysis apparatus ex-situ, it is difficult to analyze dark spots which are responsible for the degradation and shortened lifetime of OLEDs.

To prevent oxygen and moisture from reaching the devices, there is a need for in-situ analysis.

Referring to FIG. 1, the conventional method of analyzing OLEDs is performed under two conditions. Finding a dark spot (I) is performed ex-situ and analyzing the dark spot (II) is performed in-situ. In the process 1, an OLED to be analyzed is placed on an ex-situ analysis apparatus (S10) and a bias voltage is applied to the OLED (S20). At this time, a dark spot is found in the OLED (S30). Then, the area of the OLED to be analyzed is marked (S40) and the process 11 is performed.

In the process 11 of in-situ analysis, firstly the OLED with the marked area is placed in the chamber of an analyzer (S50). Then, scanning is performed through the OLED (S60) and the marked area is found (S70), repeating these operations (S60 and S70). If the marked area is found, the marked area is scanned with a focused beam (S80), to obtain local chemical information on the marked area (S90), and then the analytical results are output (S95).

As described above, when the manufactured OLED is again placed in the analyzer for in-situ analysis, it is difficult to set the position of the dark point in the analyzer, since the dark spot is small. Further, the dark spot can be confused with a defect caused by careless surface treatment of the OLED, and the OLED degrades very rapidly during ex-situ analysis, making practical analysis difficult. Moreover, since degradation of the OLED occurs very rapidly during ex-situ analysis, it has a practical difficulty in analysis for such degradation.

SUMMARY OF THE INVENTION

The present invention provides a method for analyzing performance of OLED, such as physical and chemical degradation, which cannot be observed when the OLED is inactive, by directly driving the OLED in-situ, separated from the external environment.

According to an aspect of the present invention, there is provided a method for analyzing an OLED, comprising: placing the OLED in an in-situ chamber; driving the OLED; and analyzing a dark spot and/or thermal degradation of the OLED, such that performance of the OLED can be analyzed while driving the OLED in-situ, separated from the external environment.

BRIEF DESCRIPTION OF THE DRAWINGS

This application file contains at least one drawing executed in color. Copies of the color drawings are enclosed.

The above and other features and advantages of the present invention will become more apparent by describing in detail exemplary embodiments thereof with reference to the attached drawings in which.

DETAILED DESCRIPTION OF THE INVENTION

Figure 1:
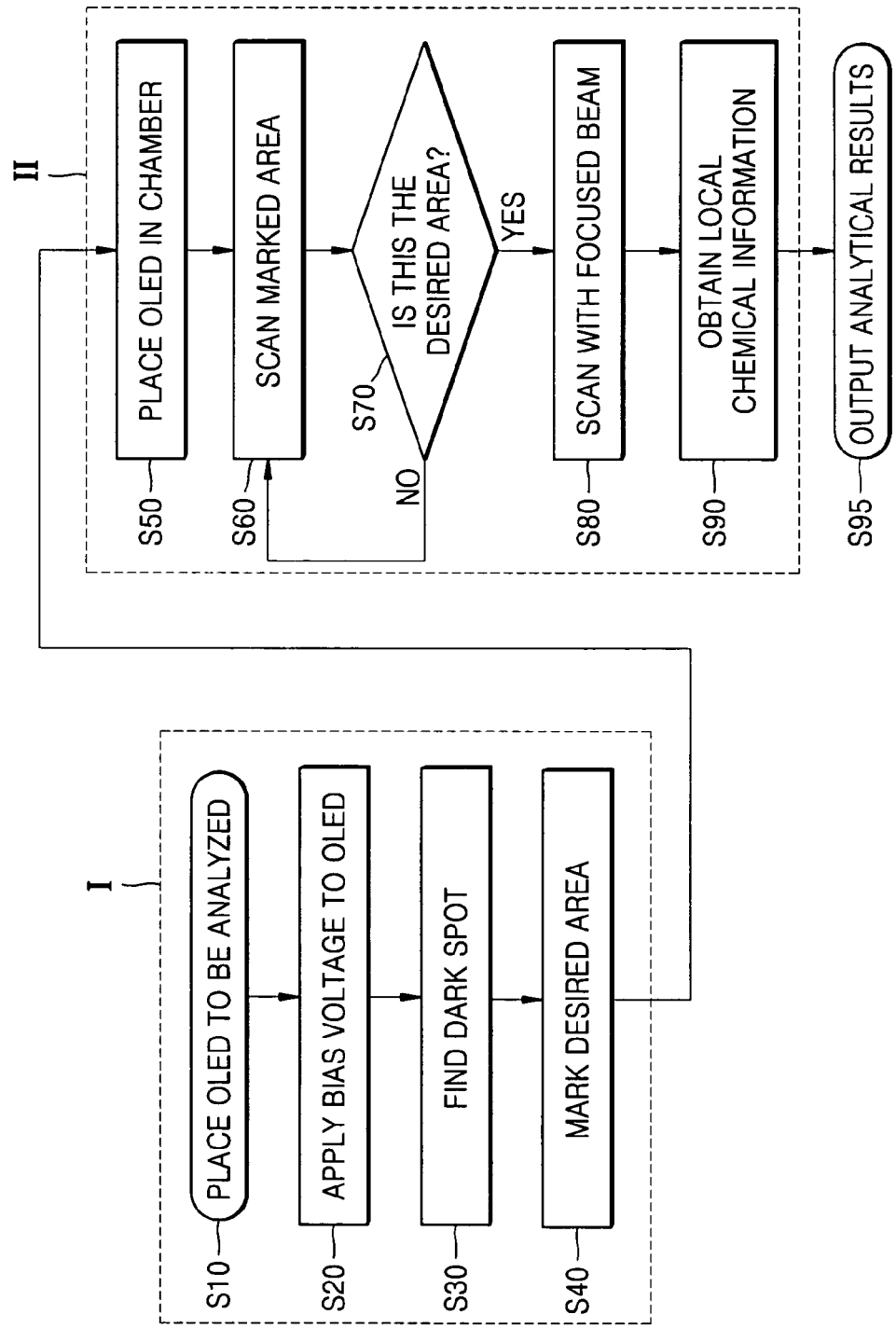
FIG. 1 is a flowchart illustrating a conventional method for analyzing an OLED.
Figure 2:
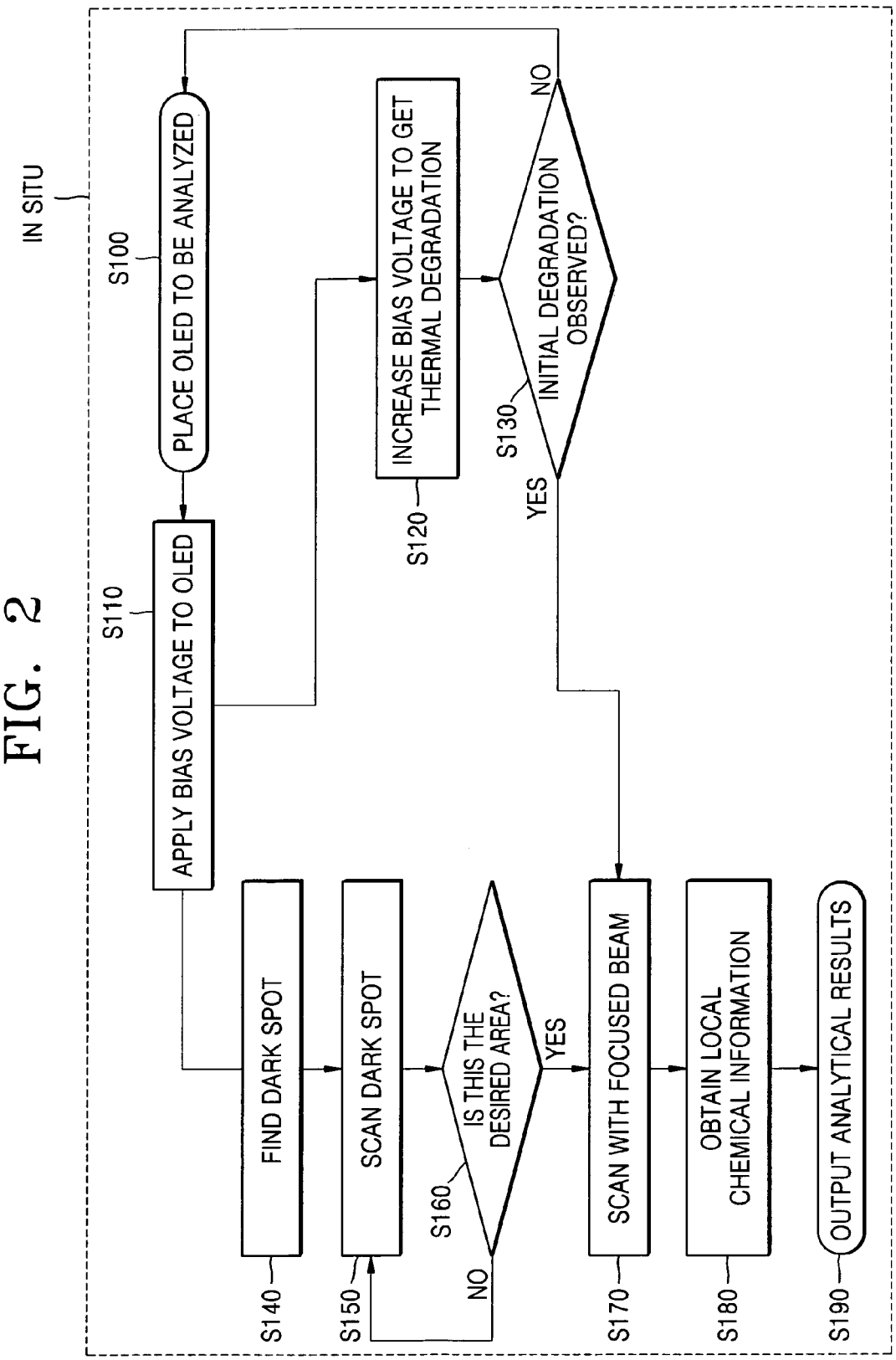
FIG. 2 is a flowchart illustrating a method for analyzing an OLED according to an embodiment of the present invention.
Figure 3:
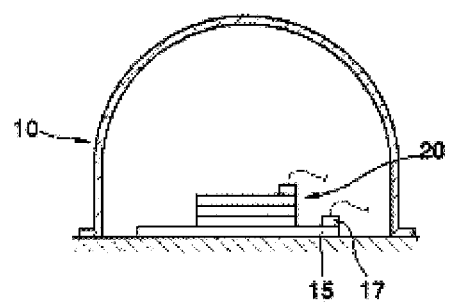
FIG. 3 is a schematic cross-sectional view illustrating a chamber in which an OLED can be analyzed in-situ.

Referring to FIGS. 2 and 3, in a method for analyzing an OLED according to an embodiment of the present invention, all processes including finding a dark spot and analyzing thermal degradation of the OLED are performed in-situ. The method will be described in detail below.

Firstly, an OLED 20 to be analyzed is placed in an in-situ chamber 10 of an analyzer (S100). The OLED 20 is manufactured under a super ultra-high vacuum of $10^{-10}$ torr. The chamber 10 is maintained under an ultra-high vacuum. A sample holder 15 holding the OLED 20 is contained in the chamber 10. The sample holder 15 has a separating terminal 17 segmented into 4 electrodes. The separating terminal is electrically connected to each of two electrodes of the OLED 20. The electrical connection is made with a conducting path of silver paste.

Then, the OLED is driven (S110). That is, a bias voltage is applied to the OLED 20 placed in the chamber 10 to drive the OLED 20 under an ultra-high vacuum. By driving the OLED in this way, a dark spot and/or thermal degradation of the OLED can be analyzed.

First, the thermal degradation analysis is described as follows. If the OLED is driven in-situ, thermal degradation is much slower than driven ex-situ, since oxygen and moisture are excluded. Thus, it is possible to directly observe initial degradation. The thermal degradation analysis comprises the following operations. First, in order to see the degree of thermal degradation of the OLED, the bias voltage applied to the OLED is increased (S120). Then, judgment on whether an initial degradation is observed is performed (S130). If the initial degradation is observed, the degradation of the OLED is observed in real time by scanning the position in the OLED to be analyzed with the focusing beam while moving a scanning probe to the position (S170). Then, after chemical information on the local area is obtained by scanning (S180), the analytical results are output (S190). In the analysis using a scanning probe, the change in electron structure of the OLED is observed and a concentrating micro-observation can be performed on a portion which is degrading. This scanning analysis may be performed by radiation photoelectron spectroscopy using a radiation photoelectron microscope. The radiation photoelectron microscope has an image processing ability for components in the analytical area, and thus chemical components in the analytical area can be confirmed and information on the analytical area can be obtained in an image form.

Second, the dark spot analysis is described as follows. A bias voltage is applied to the OLED (S110) to find the dark spot in the OLED (S140). Then, the OLED is scanned using a scanning probe (S150) to find an area to be analyzed (S160), repeating the operations (S150 and S160). If the desired area is found, it is scanned with a focusing beam (S170) to obtain a local chemical information on the area (S180) and output the analytical results (S190).

The above method of analyzing the OLED can provide essential information for discovering the mechanism of a dark spot and degradation of the OLED and confirm which layer of the OLED caused the thermal degradation.

Hereinafter, the analytical results of the above method will be described based on practical experimental data.

Figure 4:
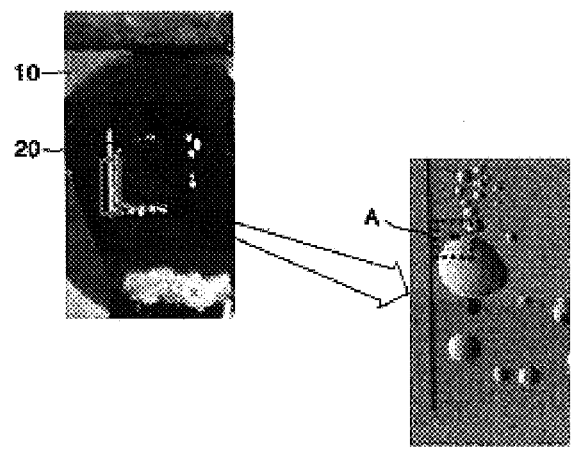
FIG. 4 is a view illustrating initial degradation of an OLED observed in-situ.
Figure 5A:
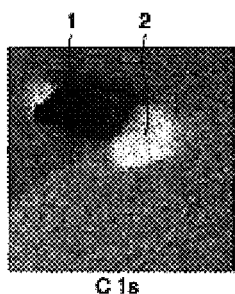
FIGS. 5A through 5C are enlarged views illustrating section A in FIG. 4.
Figure 5B:
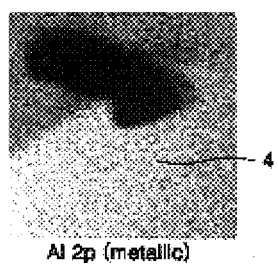
Figure 5C:
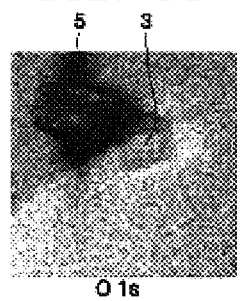

Referring to FIG. 4, in the OLED 20 placed in the chamber 10, the metal (aluminum) electrode is locally swollen and a plurality of dark spots are generated in the form of small embossed areas, due to the thermal degradation. FIG. 4 shows an image of $2p$ orbital of an aluminum electrode (Al $2p$ image) in the OLED. FIGS. 5A through 5C are enlarged views illustrating section A in FIG. 4, showing a carbon component (C $1s$), an oxygen component (O $1s$), and an aluminum component (Al $2p$ (metallic)) of the OLED. Referring to FIGS. 5A through 5C, the compositions of the components of the section A in FIG. 4 are confirmed and it can be assumed from the presence of the oxygen component described above that the measured portions exploded due to excessive degradation.

Figure 6:
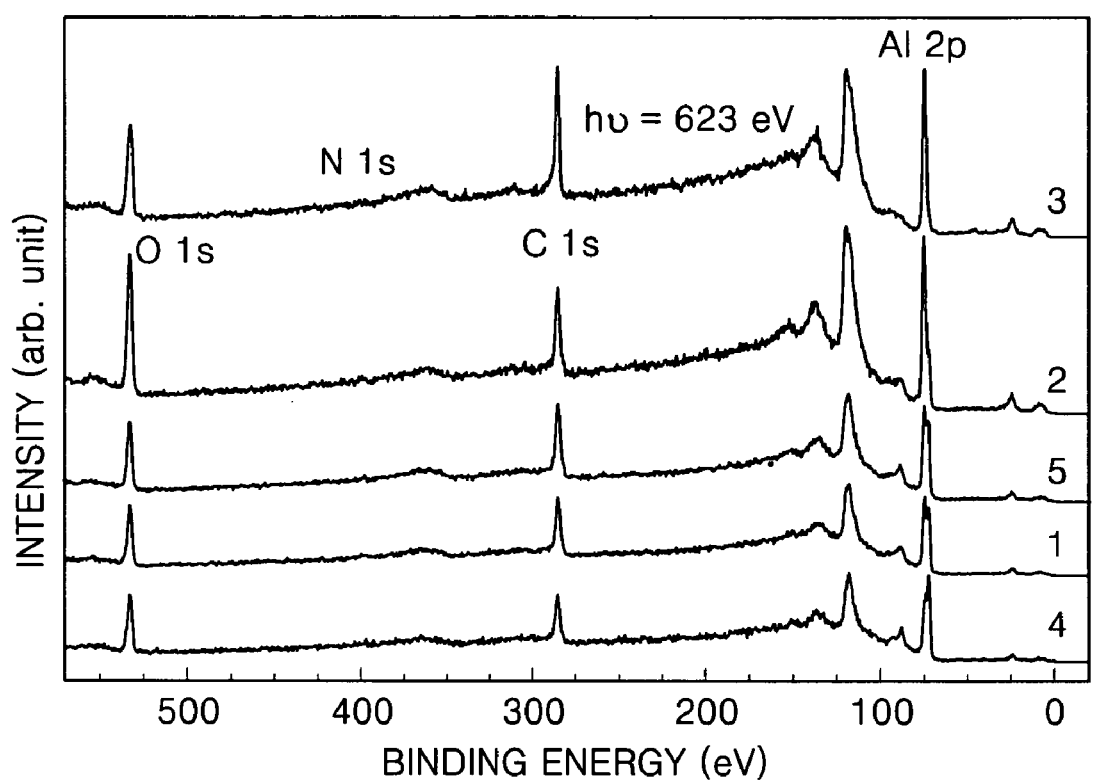
FIG. 6 is a graph of spectrums obtained by photoelectron spectroscopy of areas 1 through 5 in FIGS. 5A through 5C.

FIG. 6 is a graph of spectrums obtained by photoelectron spectroscopy of areas 1 through 5 in FIGS. 5A through 5C. Thus, the components in each area can be analyzed by examining binding energy vs. intensity distribution change using photoelectron spectroscopy. Referring to FIG. 6, components such as Al are not almost observed in a light-emitting material layer and an electrode material layer, confirming that the light-emitting layer and the electrode have disappeared from the those areas. The presence of oxygen confirms that an ITO electrode, which is the cathode of the OLED, is exposed. This shows that peeling in an organic multi-layered thin film structure mainly occurs in an ITO electrode.

Such information can aid discovery of the mechanism of the degradation effect and play an important role in expanding the lifetime and enhancing the efficiency of the OLED, which are important objectives in the development of OLEDs.

According to the method for analyzing an OLED in an embodiment of the present invention, the performance of an organic light-emitting device (OLED), such as physical and chemical degradation, which cannot be observed when the OLED is inactive, can be observed in an image form using radiation photoelectron spectroscopy by directly driving the OLED in-situ. Thus, it is possible to simplify the development process of the OLED and obtain basic information on the causes of degradation and efficiency decrease of the OLED. As a result, it is possible to provide decisive information for expanding the lifetime and enhancing efficiency of the OLED, which are the most important objectives in the development of OLEDs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for analyzing an organic light-emitting device (OLED), comprising:

placing the OLED in an in-situ chamber;

driving the OLED; and analyzing a dark spot and/or thermal degradation of the OLED, such that the performance of the OLED can be analyzed while driving the OLED in-situ, separated from the external environment, wherein the OLED is driven by applying a predetermined bias voltage to the OLED in the in-situ chamber, and wherein the analyzing thermal degradation comprises:

increasing the bias voltage applied to the OLED judging whether initial degradation is observed;

if the initial degradation is observed, scanning the position of the OLED to be analyzed with the focusing beam while moving a scanning probe to the position; and obtaining local chemical information on the scanned area.

2. The method of claim 1, wherein the analyzing the dark spot comprises:

finding the dark spot in the OLED;

scanning the OLED using a scanning probe to find an area to be analyzed; and scanning the area with a focusing beam to obtain local chemical information on the area.

3. The method of claim 1, wherein the chemical information of the OLED is obtained using radiation photoelectron spectroscopy.

4. The method of claim 3, wherein the analyzing the dark spot comprises:

finding the dark spot in the OLED;

scanning the OLED using a scanning probe to find an area to be analyzed; and scanning the area with a focusing beam to obtain local chemical information on the area.

* * * * *